US012769925B2

(12) United States Patent
Tai et al.

(10) Patent No.: US 12,769,925 B2
(45) Date of Patent: Oct. 20, 2026

(54) STATIC VOLTAGE DROP PREDICTION SYSTEM AND METHOD

(71) Applicants: TAIWAN SEMICONDUCTOR MANUFACTURING COMPANY, LTD., Hsinchu (TW); TSMC Nanjing Company Limited, Nanjing (CN)

(72) Inventors: Meng Tai, Nanjing City (CN); Chia-Chun Liao, Hsinchu City (TW); ShiWen Tan, Nanjing City (CN); Song Liu, Nanjing City (CN); Cheng Jin, Nanjing City (CN)

(73) Assignees: TAIWAN SEMICONDUCTOR MANUFACTURING COMPANY, LTD., Hsinchu (TW); TSMC NANJING COMPANY LIMITED, Nanjing (CN)

( * ) Notice: Subject to any disclaimer, the term of this patent is extended or adjusted under 35 U.S.C. 154(b) by 809 days.

(21) Appl. No.: 18/325,678

(22) Filed: May 30, 2023

(65) Prior Publication Data

US 2024/0378367 A1 Nov. 14, 2024

(30) Foreign Application Priority Data

May 10, 2023 (CN) ........................ 202310522609.4

(51) Int. Cl.
*G06F 30/398* (2020.01)
*G06F 30/392* (2020.01)

(52) U.S. Cl.
CPC .......... *G06F 30/398* (2020.01); *G06F 30/392* (2020.01)

(58) Field of Classification Search
CPC .................................................... G06F 30/398
USPC ........................................................ 716/111
See application file for complete search history.

(56) References Cited

U.S. PATENT DOCUMENTS

2020/0104458 A1* 4/2020 Chuang ................ G06F 30/327

* cited by examiner

*Primary Examiner* — Eric D Lee
(74) *Attorney, Agent, or Firm* — Birch, Stewart, Kolasch & Birch, LLP

(57) ABSTRACT

A method is provided, including following operations: receiving, by a static voltage drop (SIR) prediction circuitry, floorplan data of a floorplan layout of a semiconductor device; generating a first SIR result by a machine learning model based on the floorplan data; generating a first similarity value based on a comparison of the floorplan data with a plurality of training data; generating a second SIR result based on the first SIR result and a first compensation value, corresponding to the first similarity value, in a mapping table; and generating a bump assignment data to update the floorplan data based on a comparison between the second SIR result with a plurality of predetermined SIR values.

20 Claims, 7 Drawing Sheets

400

STATIC VOLTAGE DROP PREDICTION SYSTEM AND METHOD

CROSS REFERENCE

The present application claims priority to China Application Serial Number 202310522609.4, filed on May 10, 2023, which is herein incorporated by reference in its entirety.

BACKGROUND

In an electronic circuit design process, one or more electronic design automation (EDA) tools may be utilized to design, optimize, and verify semiconductor device designs, such as circuit designs in a semiconductor chip.

During routing, wires or interconnections may be formed to connect the various circuit elements of the placement layout. After routing, a physical verification process may be performed on the semiconductor device, and then a voltage drop analysis may be performed. The voltage drop analysis may be referred to as an IREM analysis. During the IREM analysis, the semiconductor device is analyzed to determine whether static voltage drops (SIR drops) are present which exceed or otherwise violate design rules. The SIR drops of a semiconductor device are due, at least in part, to the actual wirings or interconnections between various circuit elements or nodes in the device, and thus, SIR drop analysis is generally performed after routing of the device.

In some approaches, SIR signoff flow is time-consuming and lacks of early prevention, which consumes time. Moreover, trail and error method cannot find the optimal bump locations within limited trails and the floorplan layout revising after routing stage induces long fixing iterations, generating SIR divergency risk.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
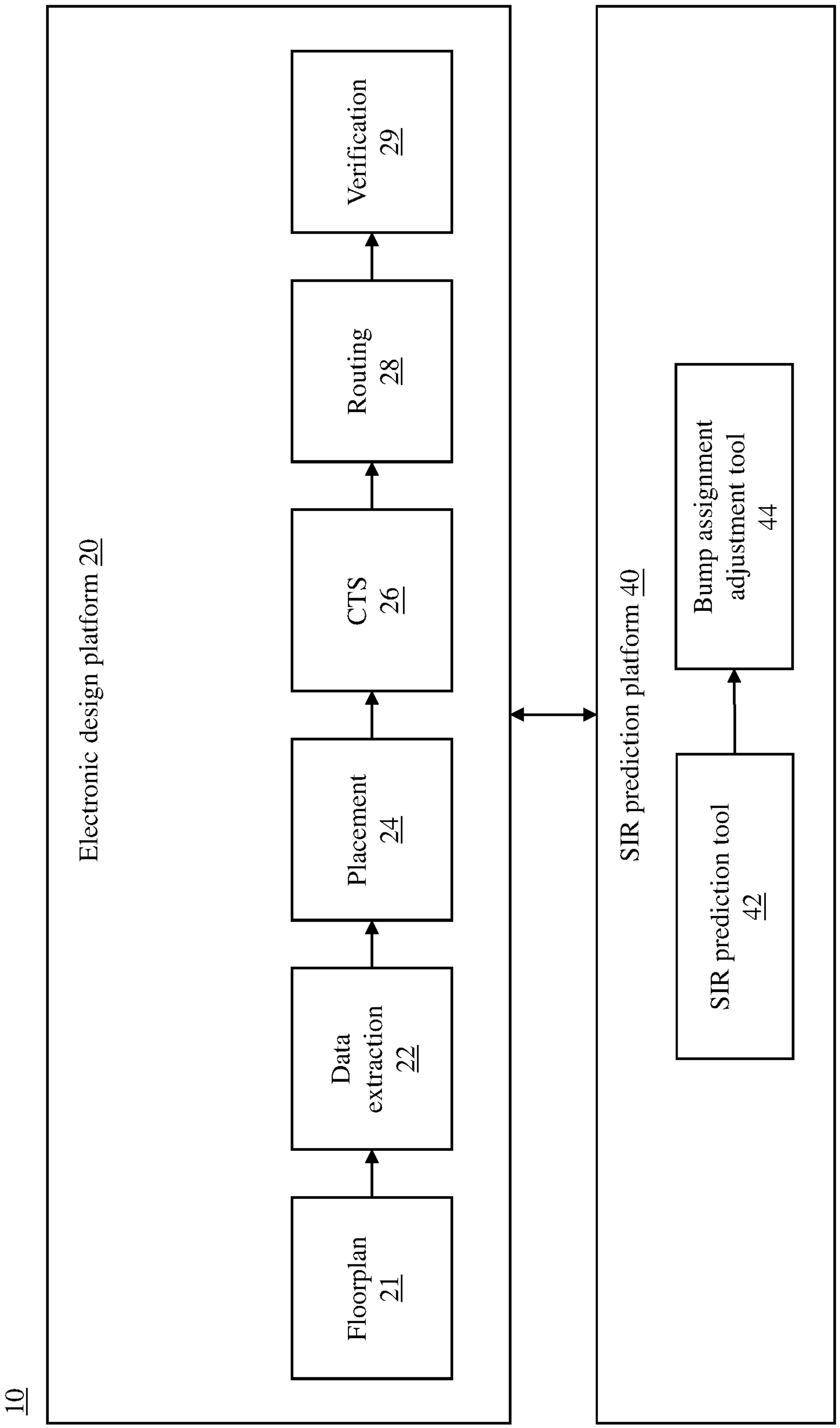
FIG. 1 is a block diagram illustrating an electronic device design system, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

As used herein, the terms "comprising," "including," "having," "containing," "involving," and the like are to be understood to be open-ended, i.e., to mean including but not limited to.

As used herein, "around", "about", "approximately" or "substantially" shall generally refer to any approximate value of a given value or range, in which it is varied depending on various arts in which it pertains, and the scope of which should be accorded with the broadest interpretation understood by the person skilled in the art to which it pertains, so as to encompass all such modifications and similar structures. In some embodiments, it shall generally mean within 20 percent, preferably within 10 percent, and more preferably within 5 percent of a given value or range. Numerical quantities given herein are approximate, meaning that the term "around", "about", "approximately" or "substantially" can be inferred if not expressly stated, or meaning other approximate values.

Embodiments provided herein include a static voltage drop (SIR) prediction system and methods for predicting SIR violations in a floorplan layout before placement is performed on the floorplan layout. In some embodiments, machine learning techniques are utilized to create and/or modify a machine learning model, and SIR prediction circuitry may predict whether one or more SIR violations would be present in a particular floorplan layout by comparing floorplan data extract from the floorplan layout with the machine learning model. In some embodiments, in response to the predicted SIR result generated by the machine learning model, bump assignment optimization is performed to find optimal bump assignment that reduces the SIR result. In some embodiments, both the SIR prediction and bump assignment optimization are performed automatically and a semiconductor device is manufactured based on an updated floorplan data having low SIR risks.

FIG. 1 is a block diagram illustrating of an electronic device design system 10. in accordance with one or more embodiments of the present disclosure. The electronic device design system 10 is operable to generate and optimize floorplan layouts after floorplan synthesis has been performed (which may be referred to herein as a floorplan design) for an electrical device before placement of the floorplan layout. The electronic device design system 10 includes an electronic design platform 20 and a static voltage drop (SIR) prediction platform 40. In some embodiments, the electronic design platform 20 and/or the SIR prediction platform 40 may be implemented in hardware, firmware, software, or any combination thereof. For example, in some embodiments, the electronic design platform 20 and/or the SIR prediction platform 40 may be at least partially implemented as instructions stored on a computer-readable storage medium, which may be read and executed by one or more computer processors or processing circuitry in an electronic design automation (EDA) system 600 shown in FIG. 6 discussed in the following paragraphs.

In some embodiments, the electronic design platform 20 and the SIR prediction platform 40 may be included in or otherwise implemented by a same apparatus, such as a same computing system or device. In other embodiments, the electronic design platform 20 and the SIR prediction platform 40 may be included in or otherwise implemented by separate apparatuses, such as separate and remotely located computing systems or devices.

The electronic design platform 20 includes electronic device design tools which can be used, for example, to design high-level programming descriptions of analog and/or digital circuitry for an electronic device. In some embodiments, the high-level programming descriptions can be implemented using a high-level programming language, such as C, C++, LabVIEW, MATLAB, a general purpose system design or modeling language, such as SysML, SMDL and/or SSDL, or any other suitable high-level programming language. In some embodiments, the electronic design platform 20 may include various additional features and functionalities, including, for example, one or more tools suitable to simulate, analyze, and/or verify the high-level programming descriptions of circuitry for the electronic device.

In some embodiments, the electronic design platform 20 includes a floorplan (e.g., also referred to as synthesis) tool 21, a data extraction tool 22, a placement tool 24, a clock tree synthesis (CTS) tool 26, and a routing tool 28, each of which may be implemented at least in part as software tools accessible to and executable by one or more computing devices, processors or the like.

The floorplan tool 21 places blocks or macros in a chip area or core area in the electronic device design according to a predetermined floorplan specification (e.g., sizes and locations of blocks or macros), a predetermined power consumptions specification (e.g., a sum of total cells' estimated power in blocks or macros), or/and a predetermined bump plan specification (e.g., bump assignment including domains, center locations, types of bumps that are contact structures configured to transmit supply voltages to cells) on a floorplan layout. In some embodiments, the floorplan tool 21 also translates one or more characteristics, parameters of features of floorplan layout, or attributes of the electronic device into one or more logic operations, one or more arithmetic operations, one or more control operations, or the like, which may then be translated into the high-level programming descriptions in terms of the analog circuitry and/or the digital circuitry.

The data extraction tool 22 is configured to extract parameters, as floorplan data, of features from the floorplan layout generated by the floorplan tool 21. For example, features grouped include properties associated with cells (e.g., standard logic cells), such like relative locations (e.g., center, boundary, corner) of cells in blocks or macros, power related features (e.g., total consumed power of cells positioned in a region having a certain radius in respect to a center where SIR violation occurs), power grid related features (e.g., density of metal tracks), physical properties of the cells to the bumps (e.g., bump pitches,) manufacture process parameters (e.g., N5, N7 . . . technology nodes), the combinations thereof, and/or any other suitable parameters for estimating SIR violation information.

The placement tool 24 generates cells which correspond to, or otherwise implement, the one or more logic operations, one or more arithmetic operations, one or more control operations, or the like produced by the floorplan tool 21. The cells may include geometric shapes which correspond to various features of semiconductor devices, including, for example, diffusion layers, polysilicon layers, metal layers, and/or interconnections between layers.

In some embodiments, the geometric shapes for some of the analog circuitry and/or the digital circuitry can be defined in accordance with a standard cell from among a predefined library of standard cells associated with a technology library. The standard cell represents one or more semiconductor devices as well as their interconnection structures that are configured and arranged to provide a logical function, such as AND, OR, XOR, XNOR, or NOT, or a storage function, such as a flipflop or a latch. The predefined library of standard cells may be defined in terms of geometric shapes which correspond to diffusion layers, polysilicon layers, metal layers, and/or interconnections between layers. Thereafter, the placement tool 24 assigns locations for the geometric shapes on a printed circuit board (PCB) and/or a semiconductor substrate.

The CTS tool 26 performs clock tree synthesis (CTS) on a design generated, for example, by the placement tool 24. Clock tree synthesis generally refers to a process of synthesizing a clock tree to achieve zero or minimal skew and insertion delay, and includes inserting clock tree cells which correspond to, or otherwise implement, clock operations for the electronic device. The clock cells may include geometric shapes which correspond to circuitry or logical devices which implement clock features of semiconductor devices, including, for example, buffers, inverters, or the like. In some embodiments, each of the clock tree cells includes one or more buffers or inverters electrically positioned along clock paths of the electronic device design. Further, in some embodiments, one or more of the clock cells may include clock gating cells, such as integrated clock gating cells (ICGs). Clock gating is a common technique for reducing clock power by shutting off the clock to modules or circuit components by utilizing a clock enable signal, and such clock gating may be implemented using integrated clock gating cells. Integrated clock gating cells may include one or more logical circuit elements, such as an OR gate, an AND gate, or a latch.

The routing tool 28 produces physical interconnections between the cells or the geometric shapes in the layout provided by the placement tool 24, for example, after clock tree synthesis has been performed on the layout by the CTS tool 26. In some embodiments, the routing tool 28 utilizes a textual or an image-based netlist describing the analog circuitry, the digital circuitry, the technology library, a semiconductor foundry for fabricating the electronic device and/or a semiconductor technology node for fabricating the electronic device to assign the interconnections between the geometric shapes.

The electronic design platform 20 may include a variety of additional tools, including, for example, a verification tool 29. The verification tool 29 may perform various verifications or checks on an electronic device layout, e.g., after placement, CTS, and routing. For example, in some embodiments, the verification tool 29 can analyze the electronic device layout and can provide a static timing analysis (STA), a SIR analysis, also referred to an IREM analysis, a Clock Domain Crossing Verification (CDC check), a formal verification, also referred to as model checking, equivalence checking, or any other suitable analysis and/or verification. In some embodiments, the verification tool 29 can perform an alternating current (AC) analysis, such as a linear small-signal frequency domain analysis, and/or a direct current (DC) analysis, such as a nonlinear quiescent point calculation or a sequence of nonlinear operating points calculated while sweeping a voltage, a current, and/or a parameter to perform the STA, the IREM analysis, or the like.

The verification tool 29 verifies that the electronic device design, including the layout of the cells or geometric shapes provided by the placement tool 24, the placement and function of the clock tree cells provided by the CTS tool 26, as well as the interconnections between the cells or geometric shapes provided by the routing tool 28, satisfies one or more specifications, rules, or the like associated with the electronic device design. The verification tool 29 may perform a physical verification, in which the verification tool 29 verifies whether an electronic device design is physically manufacturable, and that the resulting chips will meet the design specifications and will not have physical defects which prevent the chips from functioning as designed.

The verification tool 29 may perform a static voltage drop (SIR) analysis on the electronic device design. The SIR analysis may be performed, for example, as part of the IREM analysis performed by the verification tool 29. During the SIR analysis, the verification tool 29 analyzes the electronic device design, which may be a physical semiconductor device, to determine whether SIR drops are present which exceed or otherwise violate design rules or parameters which are specified for the electronic device design. SIR generally refer to drops in VDD voltage level caused by the resistance of the metal wires in the power distribution grid which distribute power or voltage to various components within the electronic device design. The verification tool 29 may utilize any techniques, conventional or otherwise, to perform the SIR analysis, including, for example, applying electrical test vectors to the electronic device design and measuring or monitoring the voltage drops throughout the electronic device design. In some embodiments, the verification tool 29 may perform the SIR analysis through simulation, for example, using software tools which simulate application of voltages to the electronic device design and which measure or monitor the resulting SIR drops throughout the electronic device design.

In some embodiments, the verification tool 29 may generate a SIR map indicating values of static voltage drops throughout the electronic device design. In some embodiments, the verification tool 29 may generate an SIR map indicating locations of SIR violations (e.g., SIR values (result) that exceed a predetermined threshold value) in the electronic device design. As will be discussed in further detail with respect to FIGS. 2 through 5, the known values (results) and locations of SIR violations, as may be derived from the SIR map generated by the verification tool 29, for various different electronic device designs may be utilized as training data to train a machine learning model to predict or determine SIR result and/or SIR violations in new floor layouts before placement has been performed.

In some embodiments, the SIR prediction platform 40 is configured to predict or determine the presence of SIR violations in a particular electronic circuit floor layout based on features of the floorplan layout, for example, as may be provided from the floorplan tool 21 and the data extraction tool 22, prior to placement of the layout by the placement tool 24. As will be discussed in further detail herein, the SIR prediction platform 40 may predict or determine the presence of SIR violations by implementing one or more machine learning approaches, for example, in which training data (such as data indicating presence and/or locations of SIR violations in electronic device designs after routing has been performed) and the corresponding SIR results are utilized to train a machine learning model to predict or determine the presence of SIR violations based on similarities or deviations between new electronic circuit placement layouts (e.g., before placement is performed) and the training data. In some embodiments, the SIR prediction platform 40 may predict or determine the complete SIR map including SIR values (results) throughout the floorplan layout, and the SIR prediction platform 40 may further predict or determine the locations of SIR violations based on the SIR map.

The SIR prediction platform 40 may include a plurality of electronic device analysis and/or design tools which may be implemented at least in part as software tools which, when executed by one or more computing devices, processors, or the like, can be utilized to analyze one or more electronic device layouts, including floorplan data of floorplan layouts for electronic devices or circuits which may be received, for example, from the electronic design platform 20 (e.g., from the data extraction tool 22). Additionally, in some embodiments, the SIR prediction platform 40 may be utilized to adjust or otherwise provide information to the electronic design platform 20 which indicates one or more adjustments to be made to the floorplan layout in order to avoid or otherwise reduce the presence of SIR violations in the further placement and CTS layout once the layout has been routed, for example, by the routing tool 28.

In some embodiments, the SIR prediction platform 40 includes a SIR prediction tool 42, and a bump assignment adjustment tool 44, each of which may be implemented at least in part as software tools accessible to and executable by one or more computing devices, processors or the like. In some embodiments, the SIR prediction tool 42 and/or the bump assignment adjustment tool 44 may be implemented as circuitry operable to perform any of the functions described herein with respect to the SIR prediction tool 42 and/or the bump assignment adjustment tool 44. In some embodiments, the electronic design platform 20 and the SIR prediction platform 40 may be integrated, and may be implemented in a same platform. For example, each of the various tools described herein with respect to the electronic design platform 20 and the SIR prediction platform 40 may be accessed or otherwise implemented, at least in part, by a same apparatus, such as a computer device.

In some embodiments, the SIR prediction platform 40 receives floorplan layouts and floorplan data from the electronic design platform 20 after features of floorplan are determined by the floorplan tool 21 and corresponding floorplan data are extracted by the data extraction tool, but before placement of cells in the placement layouts is performed, for example, by the placement tool 24. The SIR prediction platform 40 may implement a machine-learning approach to predict or determine the SIR results in floorplan layouts, and to update the floorplan data of the floorplan layouts by providing an indication of one or more recommended adjustments to the bump assignments in order to optimize or improve an overall SIR behavior of the floorplan and even further the placement and CTS layout.

For example, as will be described in further detail below, in some embodiments, the SIR prediction tool 42 may include machine learning circuitry 110 of FIG. 2 which may be trained to predict or determine the presence of SIR violations based on training data. The bump assignment adjustment tool 44 may also receive floorplan data (aforementioned features of floorplan layout that are associated with the predicted or determined SIR results from the SIR prediction tool 42) and corresponding initial bump assignment. The bump assignment adjustment tool 44 may adjust or recommend adjustments to the bump assignment for the floorplan layout in order to optimize or improve the floor layout, based on the predicted or determined SIR results.

Figure 2:
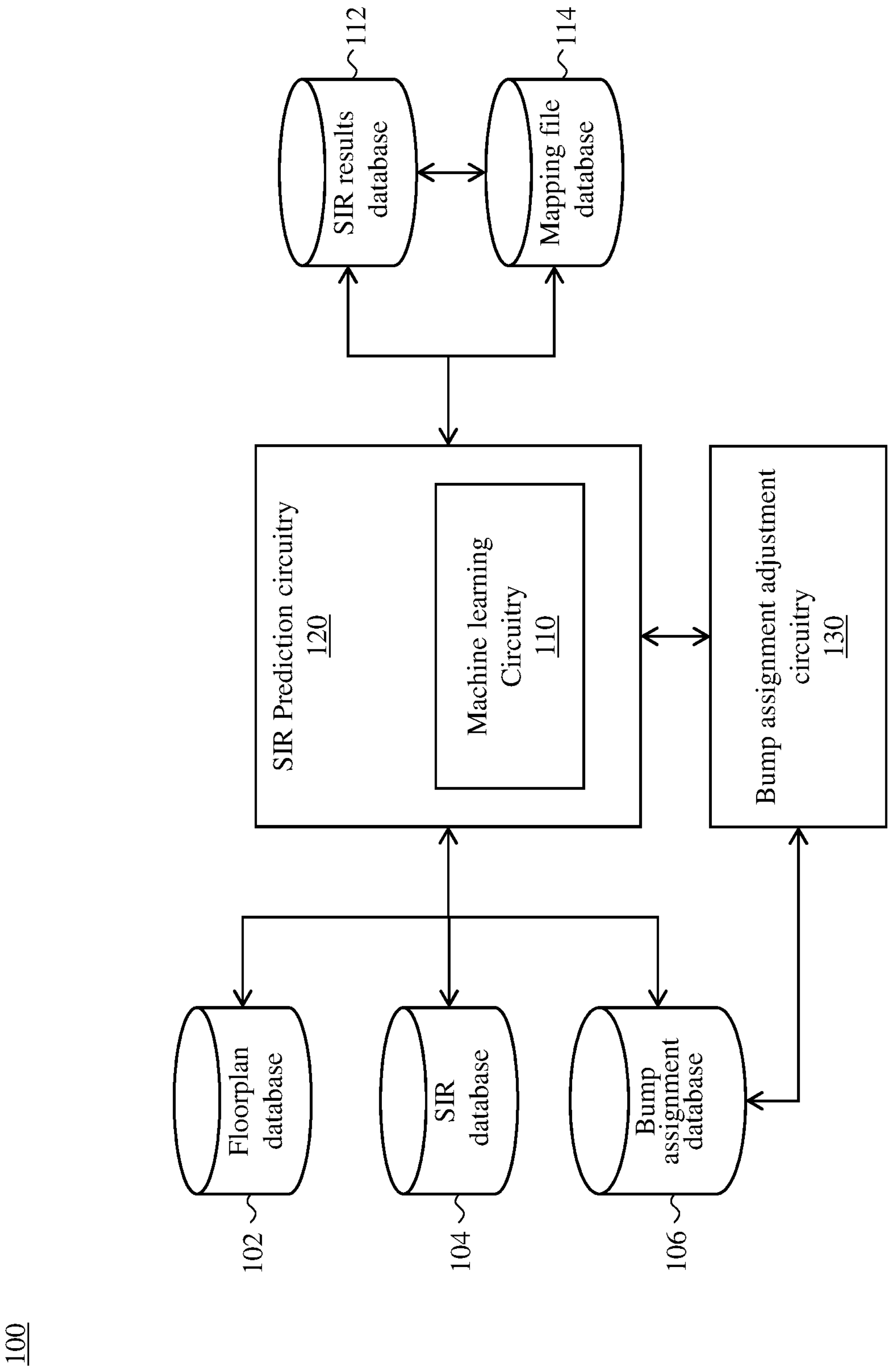
FIG. 2 is a block diagram illustrating a static voltage drop (SIR) prediction system, in accordance with some embodiments.

FIG. 2 is a block diagram illustrating a SIR prediction system 100, in accordance with embodiments of the present disclosure. The SIR prediction system 100 may be used in conjunction with, and may include one or more of the features and functionality of, the SIR prediction platform 40 shown in FIG. 1. In some embodiments, the SIR prediction system 100 is included in or implemented by the SIR prediction platform 40. For example, in some embodiments, the SIR prediction system 100 may be implemented or otherwise accessed by the SIR prediction tool 42 and the bump assignment adjustment tool 44 to predict or determine SIR results in the floorplan layouts received, for example, from the floorplan tool 21 and the data extraction tool of the electronic design platform 20 and to adjust the bump assignment of the floorplan layout.

As shown in FIG. 2, the SIR prediction system 100 includes SIR prediction circuitry 120 and a bump assignment adjustment circuitry 130. The SIR prediction circuitry 120 and the bump assignment adjustment circuitry 130 may include, or otherwise be executed by, a computer processor configured to perform the various functions and operations described herein. For example, the SIR prediction circuitry 120 and the bump assignment adjustment circuitry 130 may be executed by a computer processor selectively activated or reconfigured by a stored computer program, or may be a specially constructed computing platform for carrying out the features and operations described herein.

In some embodiments, the SIR prediction circuitry 120 includes memory which stores instructions for performing one or more of the features or operations described herein, and the SIR prediction circuitry 120 may be operable to execute instructions stored, for example, in the memory to perform the functions of the SIR prediction circuitry 120 described herein.

The SIR prediction circuitry 120 may be communicatively coupled to a floorplan database 102 and a SIR database 104. The SIR prediction circuitry 120 may access floorplan layouts and corresponding floorplan data from the floorplan database 102. The term floorplan layout is used herein to mean layouts after floorplan placing has been performed, e.g., a floorplan layout includes the blocks and macros generated by the floorplan tool 21. The floorplan layouts and floorplan data stored in the floorplan database 102 may be provided, for example, from the floorplan tool 21 and the data extraction tool 22 of the electronic design platform 20. The floorplan database 102 may be stored in one or more computer-readable memories. In some embodiments, the floorplan database 102 stores training data and test data for training a machine learning model in the machine learning circuitry 110, and the SIR database 104 stores SIR results (values) corresponding to the training data and the test SIR results (values) corresponding to the test data for training the machine learning model.

The SIR prediction circuitry 120 receives and analyzes floorplan data retrieved from the floorplan database 102 to generate a SIR result and a similarity result based on a comparison of the floorplan data with the training data by the machine learning model trained with the training data. In some embodiments, the SIR prediction circuitry 120 may separately inspect each of a plurality of regions of the floorplan layout. The inspected regions of the floorplan layout may have any size and/or shape. For example, the floorplan layout may be divided into regions based on a grid, and each cell or unit of the grid may have a size that corresponds to a size of each of the regions of the floorplan layout.

Figure 3B:
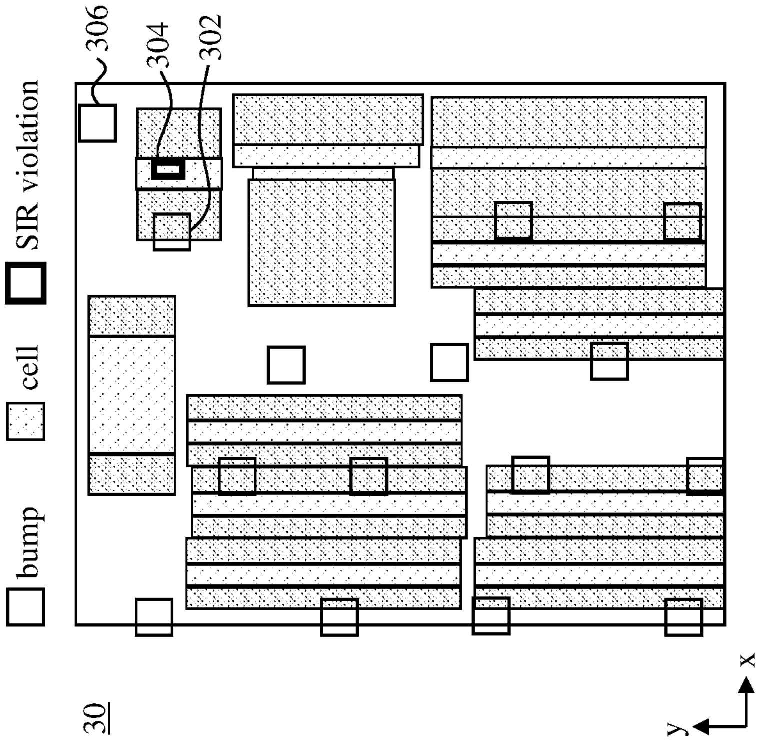
FIG. 3B is a schematic diagram illustrating part of a floor layout in which one or more SIR violations are predicted or otherwise determined to be present equipped with a bump assignment, in accordance with some embodiments.
Figure 3A:
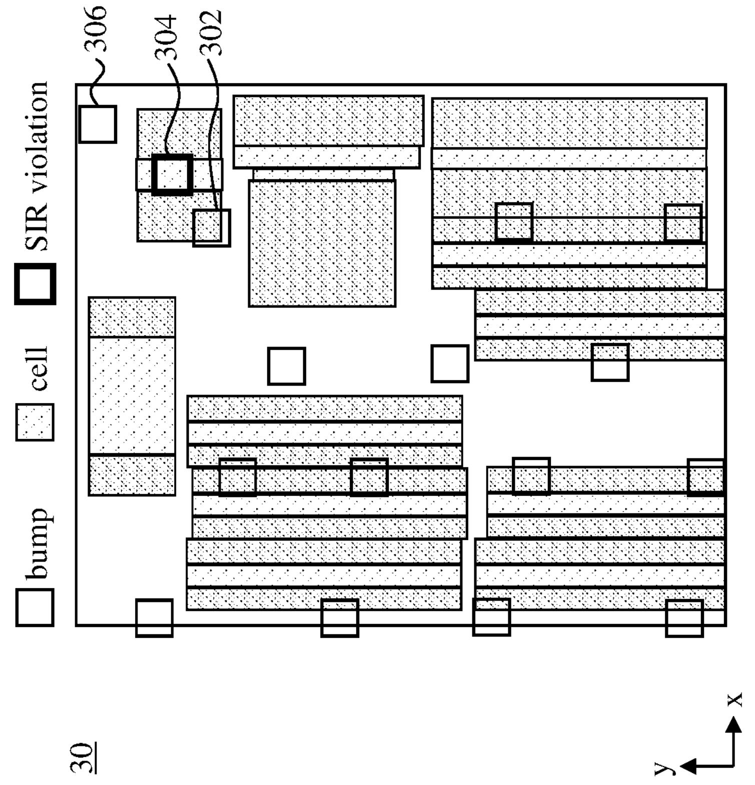
FIG. 3A is a schematic diagram illustrating part of a floor layout in which one or more SIR violations are predicted or otherwise determined to be present equipped with a bump assignment, in accordance with some embodiments.

In some embodiments, the SIR prediction circuitry 120 may generate a SIR violation map indicating locations of SIR violations in the floorplan layouts based on the SIR result by employing one or more artificial intelligence or machine learning techniques. For example, as shown in FIG. 3A, in the floorplan 30 indicating a SIR violation map of a floorplan layout are bumps 302 and a SIR violation 304. In some embodiments may be implemented at least in part by the machine learning circuitry 110. Some or all of the determinations described herein that are made by the SIR prediction circuitry 120 may be performed automatically by the SIR prediction circuitry 120, for example, in response to receiving a floorplan layout from the floorplan database 102 and the SIR database 104.

"Artificial intelligence" is used herein to broadly describe any computationally intelligent systems and methods that can learn knowledge (e.g., based on training data), and use such learned knowledge to adapt its approaches for solving one or more problems, for example, by making inferences based on a received input, such as the Floorplan layouts. Machine learning generally refers to a sub-field or category of artificial intelligence, and is used herein to broadly describe any algorithms, mathematical models, statistical models, or the like that are implemented in one or more computer systems or circuitry, such as processing circuitry, and which build one or more models based on sample data (or training data) in order to make predictions or decisions.

The SIR prediction circuitry 120 and/or the machine learning circuitry 110 may employ, for example, neural network, deep learning, convolutional neural network, Bayesian program learning, support vector machines, and pattern recognition techniques to solve problems such as predicting or determining the presence and locations of SIR violations in a placement layout. Further, the SIR prediction circuitry 120 and/or the machine learning circuitry 110 may implement any one or combination of the following computational algorithms and/or techniques: classification, regression, supervised learning, unsupervised learning, feature learning, clustering, decision trees, or the like.

As one example, an artificial neural network may be utilized by the SIR prediction circuitry 120 and/or the machine learning circuitry 110 to develop, train, and/or update one or more machine learning models which may be utilized to generate SIR result to predict or determine the presence and locations of SIR violations in a floorplan layout. An example artificial neural network may include a plurality of interconnected "neurons" which exchange information between each other. The connections have numeric weights that can be tuned based on experience, and thus neural networks are adaptive to inputs and are capable of learning. The "neurons" may be included in a plurality of separate layers which are connected to one another, such as an input layer, a hidden layer, and an output layer. The neural network may be trained by providing training data (e.g., past data which indicates the presence and locations of SIR violations in electronic device designs after routing has been performed) to the input layer. Through training, the neural network may generate and/or modify the hidden layer, which represents weighted connections mapping the training data provided at the input layer to known output information at the output layer (e.g., classification of an input electronic device design after routing has been performed as including SIR violations and their locations). Relationships between neurons of the input layer, hidden layer, and output layer, formed through the training process and which may include weight connection relationships, may be stored, for example, as one or more machine learning models within or otherwise accessible to the machine learning circuitry 110.

Once the neural network has been sufficiently trained, the neural network may be provided with test data at the input layer. Utilizing SIR drop violation knowledge (e.g., as stored in the machine learning model, and which may include, for example, weighted connection information between neurons of the neural network), the neural network may make determinations about the received floor data of the floorplan layout at the output layer. For example, the neural network may generate SIR results (including locations and/or SIR values) to predict or determine the presence and locations of SIR violations in the floorplan layout.

Employing one or more computationally intelligent and/or machine learning techniques, the SIR prediction circuitry 120 may learn (e.g., by developing and/or updating a machine learning algorithm or model based on training data) to SIR result, and in some embodiments, the SIR prediction circuitry 120 may make some predictions or determinations based at least in part on knowledge, inferences or the like developed or otherwise learned through training of the machine learning circuitry 110.

The machine learning circuitry 110 may be implemented in one or more processors having access to instructions, which may be stored in any computer-readable storage medium, which may be executed by the machine learning circuitry 110 to perform any of the operations or functions described herein.

In some embodiments, the machine learning circuitry 110 is communicatively coupled to the floorplan database 102 and the SIR database 104 and trained by the training data, the test data, the SIR results (values) corresponding to the training data and the test SIR results (values) corresponding to the test data stored in the floorplan database 102 and the SIR database 104. In some embodiments, the aforementioned data and values are corresponding to actual electronic device designs, e.g., after routing has been performed. As shown in FIG. 2, in some embodiments, the predicted SIR results are stored in an SIR result database 112 communicatively coupled to the SIR prediction circuitry 120.

According to some embodiments, other training data may include manually-entered input, such as one or more variable or adjustable parameters, coefficient values, labels, classifiers, or the like, to adjust or otherwise manage the machine learning model developed in the machine learning circuitry 110 and/or stored in the floorplan database 102 through the training process. Training may be based on a wide variety of learning algorithms or models, including, for example, support vector machines, linear regression, logistic regression, naive Bayes, linear discriminant analysis, decision trees, k-nearest neighbor, neural networks, or the like. An example of training of the machine learning circuitry 110 based on a neural network is provided previously herein.

In addition to training the machine learning circuitry 110 for predicting SIR result corresponding to the floorplan data, the SIR prediction circuitry 120 further sorts the training data for an adversarial model to generate similarity values based on the training data that are sorted and the test data, and generates compensation values based on a comparison between predicted SIR values generated by the machine learning circuitry 110 and test SIR values corresponding to the test data. For example, as the known difference of the bump pitch between the training data and the test data dominates the determinations of the similarity values, other features in the training data are sorted from the training data and values of bump pitch in the training data are sent to the adversarial model. By calculating the difference between the predicted SIR values and actual test SIR values, the compensation values are generated. In some embodiments, the similarity values are inversely proportional to the compensation values. For example, when similarity value A is relatively large, indicating the difference between the training data and the test data being small, the corresponding compensation value is relative small as the prediction of the machine learning model provides relatively high accuracy.

In some embodiments, the SIR prediction circuitry 120 is communicatively coupled to a mapping files database 114 that is configured to store the compensation values and similarity values in a mapping table.

After the machine learning model in the machine learning circuitry 110 is trained, the trained machine learning circuitry 110 may generate a SIR result and a first similarity result based on the received floorplan. The SIR prediction circuitry 120 further looks up the mapping table for a first compensation value corresponding to the first similarity result and further adjusts the SIR result by adding the first compensation value with the SIR result.

The SIR prediction circuitry 120 further compares the SIR result with a SIR threshold value and predicts an optimized SIR result based on the SIR result and bump assignments stored in a bump assignment database 106 before placing the cells in the floorplan layout when the SIR result is greater than the SIR threshold value. For example, as shown in the embodiments of FIGS. 3A-3B, the maximum SIR value (e.g., 3.56%) in the SIR result in FIG. 3A is predicted to be greater than a threshold value (e.g., 3.5%).

Accordingly, bump assignment optimization is applied in response to the SIR prediction circuitry 120 predicting the optimized SIR result. In some embodiments, referring again to FIG. 1, the bump assignment adjustment tool 44 may adjust an analyzed floorplan layout based on a predicted SIR result. In some embodiments, the bump assignment adjustment tool 44 is implemented by the bump assignment adjustment circuitry 130 of FIG. 4. Specifically, the bump assignment adjustment circuitry 130 receives the floorplan data and the predicted SIR result. Moreover, the bump assignment adjustment circuitry 130 adjust parameters (e.g., bump pitch between bumps in the bump assignments, locations of the bumps) to generate several bump assignments in the bump assignment database 106.

The SIR prediction circuitry 120 retrieves bump assignments from the bump assignment database 106 and the machine learning circuitry 110 further generates bump SIR results each corresponding to the floorplan data and one of the bump assignments. The SIR prediction circuitry 120 determines a lowest value, of the bump SIR result, as the optimized SIR result and further update the floorplan data with the bump assignment corresponding to the lowest bump SIR result. For example, comparing the embodiments of FIGS. 3A-3B, the maximum SIR value in the SIR result reduces from for example around 3.56% to around 3.16% by moving the bump 302 toward positive y direction to reduce bump pitch in the bump assignment in FIG. 3B. In addition, a SIR violations number reduces by around 65.32%.

Figure 4:
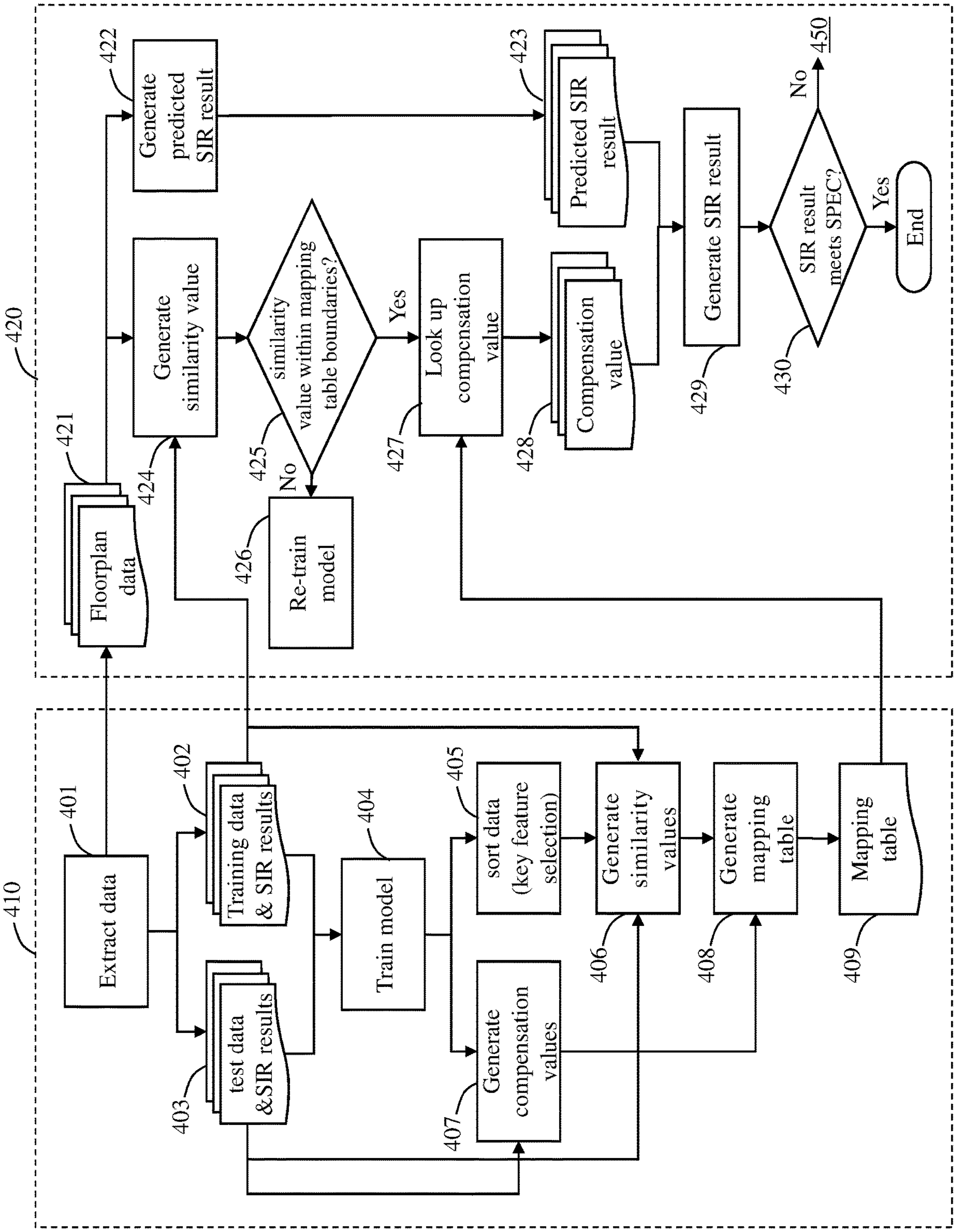
FIG. 4 is a flowchart illustrating a method for a SIR prediction, in accordance with one or more embodiments.

FIG. 4 is a flowchart illustrating a method 400 for a SIR prediction, in accordance with one or more embodiments. As shown in FIG. 4, the method includes two branches—a model training branch 410 and a SIR prediction branch 420. In the model training branch 410, training data and corresponding SIR results (e.g., SIR values) in known electronic device designs may be utilized to train a machine learning model, such as a machine learning model implemented by the machine learning circuitry 110 and which may be at least partially stored, for example, in the floorplan database 102 and SIR database 104. In the SIR prediction branch 420, new floorplan data of a floor layout (e.g., as generated by the floorplan tool 21 and the data extraction tool 22) are analyzed (e.g., by the SIR prediction circuitry 120) to generate predicted SIR result in the floorplan layout before placement is performed on the floorplan layout. Additionally, the bump optimization will be activated in response to the SIR results generated in the SIR prediction branch 420.

At operation 401 in the model training branch 410, before a placement stage utilizing the placement tool 24 training data are extracted from training floorplan layouts stored in, for example, the floorplan database 102 and test data are extracted from test floorplan layouts.

The combinations 402 of the training data and corresponding training SIR results and the combinations 403 of the test data and corresponding test SIR results are utilized for operation 404 of training the machine learning model in the machine learning circuitry 110.

At operation 405, the features of SIR prediction model are sorted by importance. Alternatively stated, the training data are sorted to obtain selected key features as the input of building the adversarial detection model.

At operation 406, similarity values are generated by an adversarial detection model implemented in the machine learning circuitry 110 and trained based on the sorted training data and test data. Specifically, in some embodiments, binary classification is performed to calculate similarity values between the training data and the test data. As the difference between training data and the test data goes small, the corresponding similarity value goes large.

At operation 407, compensation values are generated based on difference between predicted SIR values generated by the machine learning model and test SIR values corresponding to the test data.

At operation 408, a mapping table 409 which may be stored in the mapping file database 114 is generated to include compensation values and similarity values. In some embodiments, an exemplary mapping table is given as below:

TABLE I mapping table of similarity value and compensation value

| | | | | | | | |
|---|---|---|---|---|---|---|---|
| Similarity value | 0.5349 | 0.536 | 0.5376 | 0.5452 | 0.5581 | 0.561 | 0.5962 |
| Compensation value | 0.0612 | 0.053 | 0.0804 | 0.0285 | 0.0743 | 0.132 | 0.1704 |

In the SIR prediction branch 420, a floorplan data 421 extracted from a floorplan being inspected is received by the machine learning model.

At operation 422, a predicted SIR result 423 is generated by the machine learning model based on the floorplan data 421.

At operation 424, by the SIR prediction circuitry 120 comparing the training data and the floorplan data, a similarity value is generated.

At operation 425, the SIR prediction circuitry 120 determines whether the similarity value generated in operation 424 is within boundaries of the mapping table 409. For example, when the similarity value is out of the range (for example, <0.5349 or >0.5962 as shown Table I for reference), operation 426 is performed to re-train the machine learning model by the floorplan data. Alternatively stated, when the similarity value is excluded from the mapping table 409, the machine learning model is re-trained. In contrast, when the similarity value is within the range of the boundaries of the mapping table, operation 427 is performed. In some embodiments, the highest and lowest values of the similarity values are referred to as threshold values of boundaries of the mapping table 409.

At operation 427, the SIR prediction circuitry 120 looks up a corresponding compensation value 428 in the mapping table 409 according to the similarity value. For example, the similarity value between test data and training data is 0.559 and falls in a range between 0.5581~0.561. The corresponding compensation value in the mapping table I is 0.0743.

At operation 429, the SIR result is generated by compensating the predicted SIR result 423 with the compensation value 428. The SIR result equals to a sum of the predicted SIR result and the compensation value. In some embodiments, one or more SIR violations in the same floorplan layout are compensated by the same compensation value.

At operation 430, the SIR prediction circuitry 120 further determines whether the SIR result generated in operation 429 meets the design specification. When the SIR result meets the design specification (e.g., including cells' upper limit of the allowable voltage drop), it indicates that the floorplan layout having the floorplan data is verified for other operations in the electronic design platform 20. When the SIR result does not meet the design specification, the method 400 further includes a bump optimization branch 450.

Figure 5:
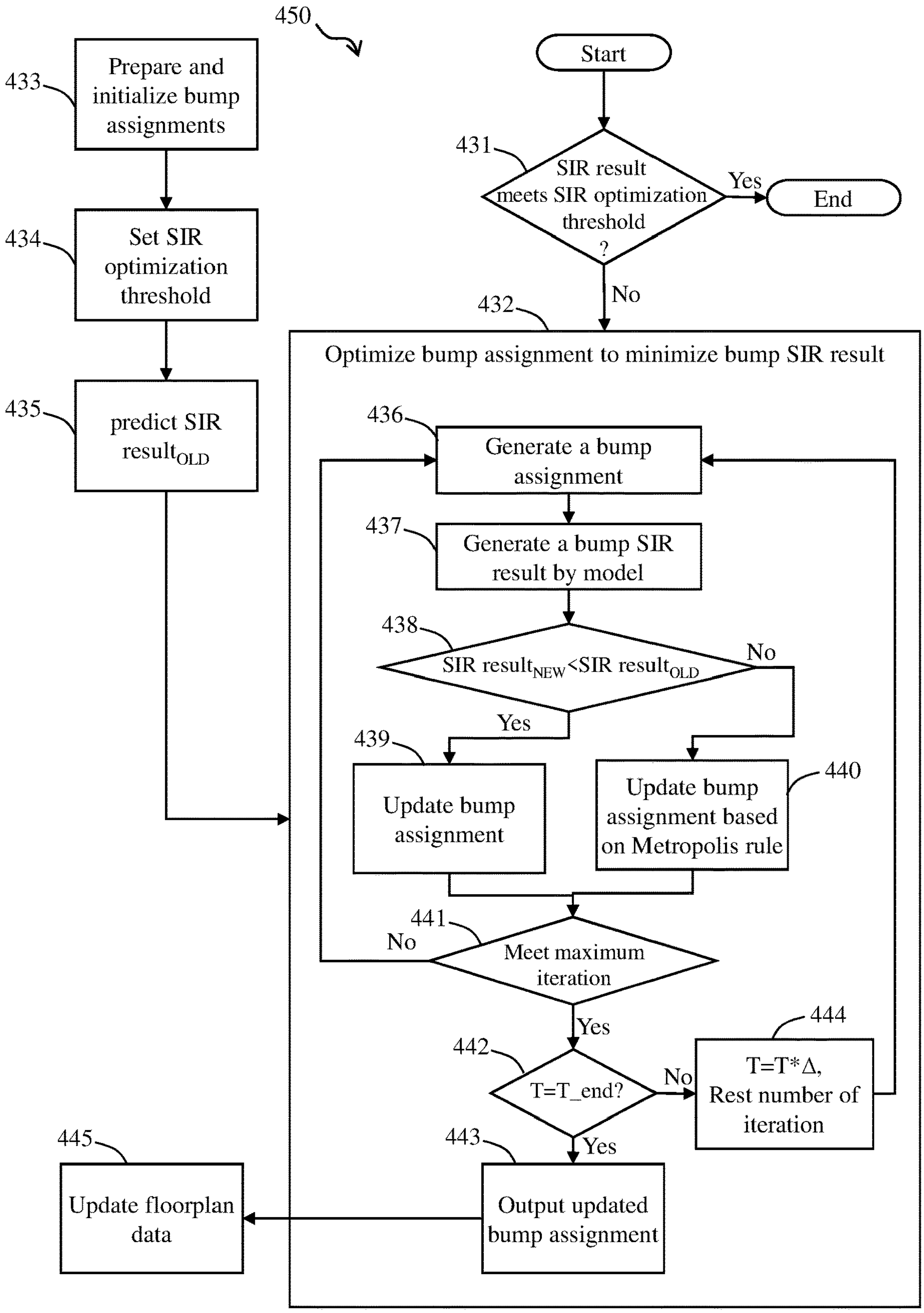
FIG. 5 is a flowchart illustrating a method corresponding to FIG. 4, in accordance with one or more embodiments.

FIG. 5 is a flowchart illustrating the method 400 corresponding to FIG. 4, in accordance with one or more embodiments. In the bump optimization branch 450, at operation 431, the bump assignment adjustment circuitry 130 determines whether the SIR result meets predefined SIR optimization threshold set in operation 434. When the SIR result does not meet predefined SIR optimization threshold, operation 432 is perform to find optimal bump assignment. In some embodiments, the bump optimization branch 450 of the method 400 is referred to as a heuristic method to approximately find a globally optimized combination of bump assignment based on the SIR result.

In addition, operations 433-435 are performed. At operation 433, bump assignments are prepared. In some embodiments, the amount of bump assignments determines the scope of the bump assignment optimization. Alternatively stated, the more the bump assignments are, the more options are for selecting the optimal bump assignment for the floorplan layout.

At operation 434, the SIR optimization threshold is set as one of the stopping conditions of the bump optimization.

At operation 435, one of the bump assignments corresponding to the SIR result obtained in operation 429 is predicted to be an initial one having a worse bump SIR result and a SIR $\text{result}_{OLD}$ for the following operations.

After the operation 435, the operation 436 is performed to generate a new bump assignment based on one of the bump assignments in operation 433. The bump assignment specifies in regions fixed bumps and moved bumps with respect to the initial bump assignment.

At operation 437, the machine learning model generates the bump SIR result that is referred to as a SIR $\text{result}_{NEW}$ corresponding to the bump assignment from operation 436 and the floorplan data.

At operation 438, the SIR $\text{result}_{NEW}$ is compared with the SIR $\text{result}_{OLD}$ to obtain an updated bump assignment. When the SIR $\text{result}_{NEW}$ is smaller than SIR $\text{result}_{OLD}$, operation 439 is performed to update the optimal bump assignment with the bump assignment in operation 436 and to replace the optimal bump SIR result with the one in operation 437.

In contrast, when the SIR $\text{result}_{NEW}$ is not smaller than SIR $\text{result}_{OLD}$, operation 440 is performed to update the optimal bump assignment and to replace the optimal bump SIR result based on the Metropolis rule defined as below:

$$e^{\frac{SIR\ \text{result}_{OLD} - SIR\ \text{result}_{NEW}}{kT}} > n$$

in which n corresponds to a random value ranging between 0 and 1, T corresponds to current temperature, and k is Bolzman constant.

When the Metropolis rule is fulfilled, the optimal bump assignment is updated with the bump assignment in operation 436 and the optimal bump SIR result is replaced by the one in operation 437.

Operations 436-440 iterates until a maximum iteration of optimization reaches a pre-determined number at operation 441 and operation 442 is performed. At operation 442, it is determined whether the current temperature T equals to the stop temperature T_end. When the current temperature T equals to the stop temperature T_end, operation 443 is performed to output the updated optimal bump assignment by the bump assignment adjustment circuitry 130 to further update the floorplan data stored in the floorplan database 102 at operation 445.

In contrast, when the current temperature T does equal to the stop temperature T_end, operation 444 is performed to multiply the current temperature T by a number A and to further rest the number of iteration to perform operation 436.

In some embodiments, the 400 further includes operations of comparing the updated optimal bump SIR result with the SIR optimization threshold set in operation 434 to output the updated optinal bump assignment for the bump assignment data. For example, when the updated optimal bump SIR result is smaller or equal to the SIR optimization threshold, the bump assignment adjustment circuitry 130 output the updated optimal bump assignment to update the floorplan data.

With reference to FIGS. 4-5 together, after operation 445, the floorplan data 421 is updated and operations 422-430 are performed to generate and verify the SIR result being a sum of new predicted SIR result and a compensation value associated with the updated floorplan data and the training data.

The method 400 further includes operation of manufacturing the semiconductor device including electronic device designed based on the updated floorplan layout.

The configurations of FIGS. 1-5 are given for illustrative purposes. Various implements are within the contemplated scope of the present disclosure. For example, in some embodiments, the data extraction tool 22 and the SIR prediction platform 40 are configured to cooperate to predict the SIR result after one or more processes performed by the placement tool 24, the CTS tool 26, and the routing tool 28.

Figure 6:
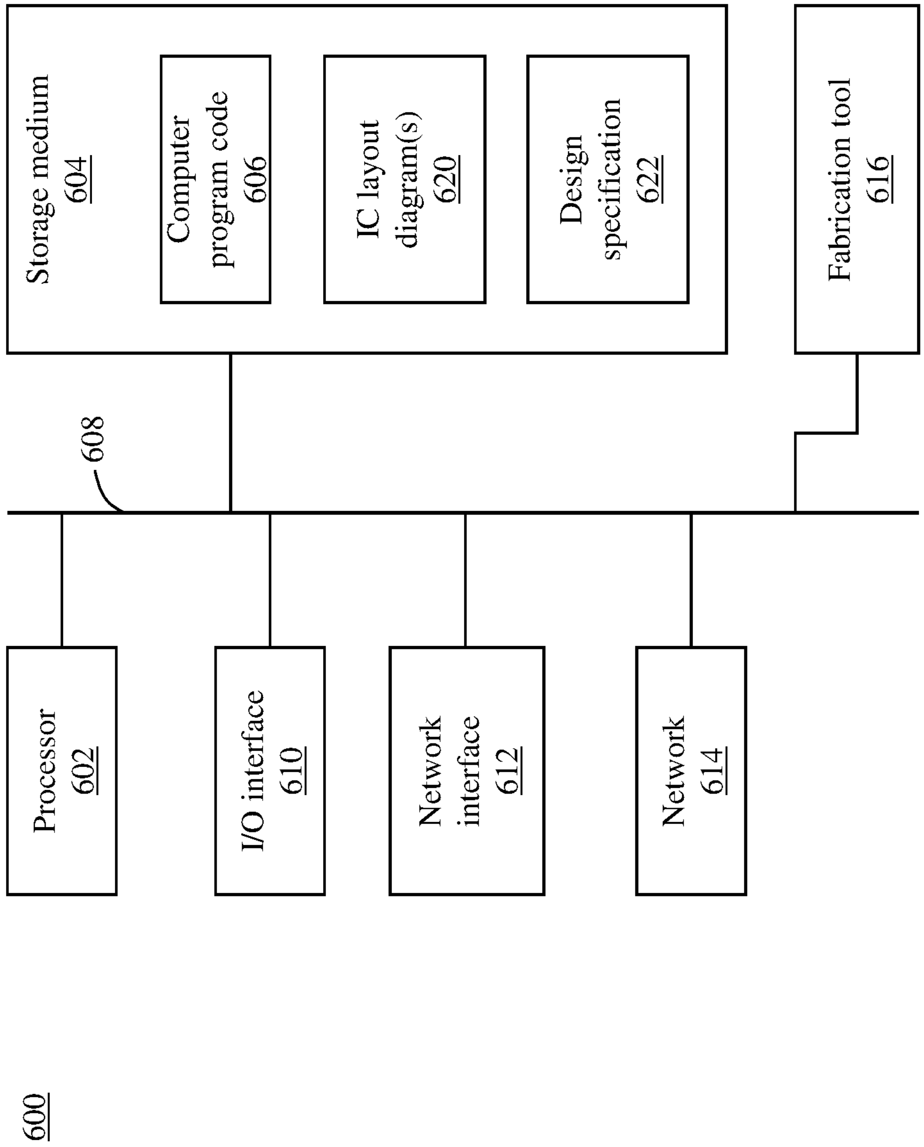
FIG. 6 is a block diagram of electronic design automation (EDA) system for designing the integrated circuit layout design, in accordance with some embodiments of the present disclosure.

Reference is now made to FIG. 6. FIG. 6 is a block diagram of electronic design automation (EDA) system 600 for designing the integrated circuit layout design, in accordance with some embodiments of the present disclosure. EDA system 600 is configured to implement one or more operations of the method 400 disclosed in FIGS. 4-5, and further explained in conjunction with FIGS. 1-3B. In some embodiments, EDA system 600 includes an APR system.

In some embodiments, EDA system 600 is a general purpose computing device including a processor 602 and a non-transitory, storage medium 604. Storage medium 604, amongst other things, is encoded with, i.e., stores, computer program code (instructions) 606, i.e., a set of executable instructions. Execution of computer program code 606 by processor 602 represents (at least in part) an EDA tool which implements a portion or all of, e.g., the method 400.

The processor 602 is electrically coupled to storage medium 604 via a bus 608. The processor 602 is also electrically coupled to an I/O interface 610 and a fabrication tool 616 by bus 608. A network interface 612 is also electrically connected to processor 602 via bus 608. Network interface 612 is connected to a network 614, so that processor 602 and (computer-readable) storage medium 604 are capable of connecting to external elements via network 614. The processor 602 is configured to execute computer program code 606 encoded in storage medium 604 in order to cause EDA system 600 to be usable for performing a portion or all of the noted processes and/or methods. In one or more embodiments, processor 602 is a central processing unit (CPU), a multi-processor, a distributed processing system, an application specific integrated circuit (ASIC), and/or a suitable processing unit.

In one or more embodiments, storage medium 604 is an electronic, magnetic, optical, electromagnetic, infrared, and/or a semiconductor system (or apparatus or device). For example, storage medium 604 includes a semiconductor or solid-state memory, a magnetic tape, a removable computer diskette, a random access memory (RAM), a read-only memory (ROM), a rigid magnetic disk, and/or an optical disk. In one or more embodiments using optical disks, storage medium 604 includes a compact disk-read only memory (CD-ROM), a compact disk-read/write (CD-R/W), and/or a digital video disc (DVD).

In one or more embodiments, storage medium 604 stores computer program code 606 configured to cause EDA system 600 (where such execution represents (at least in part) the EDA tool) to be usable for performing a portion or all of the noted processes and/or methods. In one or more embodiments, storage medium 604 also stores information which facilitates performing a portion or all of the noted processes and/or methods. In one or more embodiments, storage medium 604 stores IC layout diagram 620 of standard cells including such standard cells as disclosed herein, for example, a cell including in the floorplans 30 with respect to FIGS. 3A-3B.

EDA system 600 includes I/O interface 610. I/O interface 610 is coupled to external circuitry. In one or more embodiments, I/O interface 610 includes a keyboard, keypad, mouse, trackball, trackpad, touchscreen, and/or cursor direction keys for communicating information and commands to processor 602.

EDA system 600 also includes network interface 612 coupled to processor 602. Network interface 612 allows EDA system 600 to communicate with network 614, to which one or more other computer systems are connected. Network interface 612 includes wireless network interfaces such as BLUETOOTH, WIFI, WIMAX, GPRS, or WCDMA; or wired network interfaces such as ETHERNET, USB, or IEEE-1064. In one or more embodiments, a portion or all of noted processes and/or methods are implemented in two or more EDA systems 600.

EDA system 600 also includes the fabrication tool 616 coupled to processor 602. The fabrication tool 616 is configured to fabricate integrated circuits, according to the design files, e.g., the floorplans 30 with respect to FIGS. 3A-3B, processed by the processor 602.

EDA system 600 is configured to receive information through I/O interface 610. The information received through I/O interface 610 includes one or more of instructions, data, design rules, libraries of standard cells, and/or other parameters for processing by processor 602. The information is transferred to processor 602 via bus 608. EDA system 600 is configured to receive information related to a UI through I/O interface 610. The information is stored in computer-storage medium 604 as design specification 622.

In some embodiments, a portion or all of the noted processes and/or methods are implemented as a standalone software application for execution by a processor. In some embodiments, a portion or all of the noted processes and/or methods are implemented as a software application that is a part of an additional software application. In some embodiments, a portion or all of the noted processes and/or methods are implemented as a plug-in to a software application. In some embodiments, at least one of the noted processes and/or methods are implemented as a software application that is a portion of an EDA tool. In some embodiments, a portion or all of the noted processes and/or methods are implemented as a software application that is used by EDA system 600. In some embodiments, a layout diagram which includes standard cells is generated using a suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, for example, one or more of an optical disk, such as a DVD, a magnetic disk, such as a hard disk, a semiconductor memory, such as a ROM, a RAM, a memory card, and the like.

Figure 7:
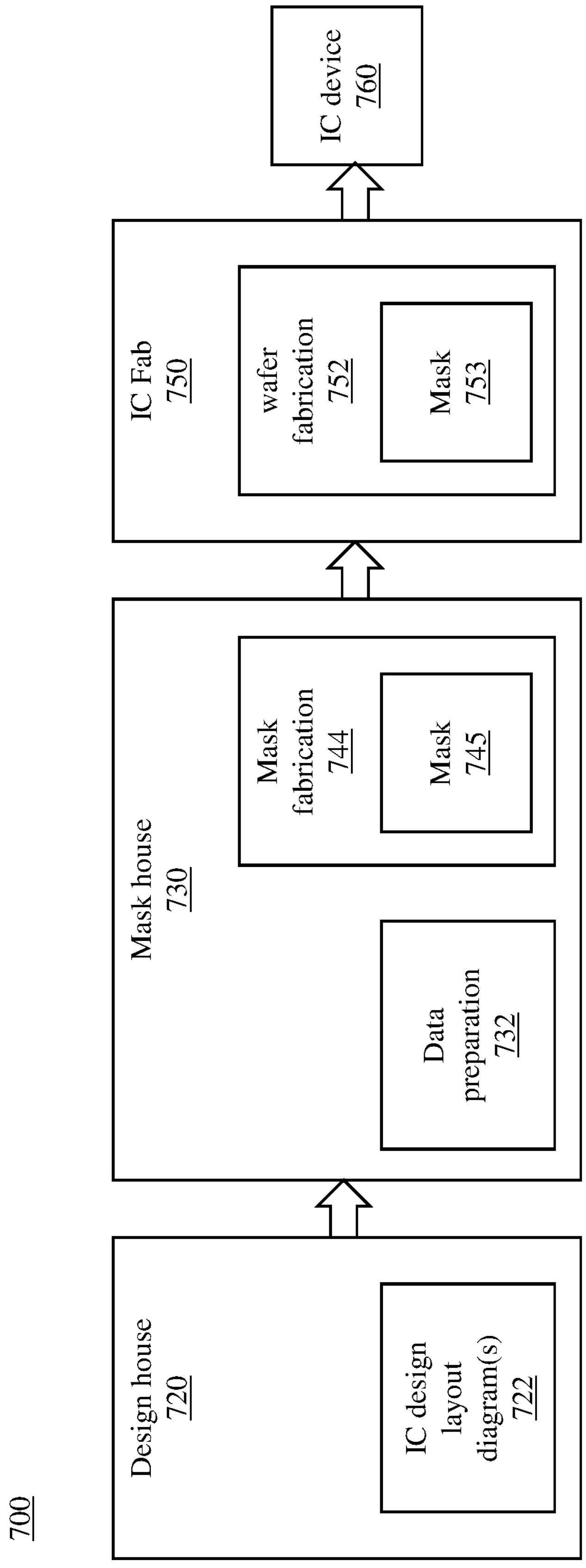
FIG. 7 is a block diagram of IC manufacturing system, and an IC manufacturing flow associated therewith, in accordance with some embodiments.

FIG. 7 is a block diagram of IC manufacturing system 700, and an IC manufacturing flow associated therewith, in accordance with some embodiments. In some embodiments, based on a layout diagram, at least one of (A) one or more semiconductor masks or (B) at least one component in a layer of a semiconductor integrated circuit is fabricated using IC manufacturing system 700.

In FIG. 7, IC manufacturing system 700 includes entities, such as a design house 720, a mask house 730, and an IC manufacturer/fabricator ("fab") 750, that interact with one another in the design, development, and manufacturing cycles and/or services related to manufacturing an IC device 760. The entities in IC manufacturing system 700 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 720, mask house 730, and IC fab 750 is owned by a single entity. In some embodiments, two or more of design house 720, mask house 730, and IC fab 750 coexist in a common facility and use common resources.

Design house (or design team) 720 generates an IC design layout diagram 722. IC design layout diagram 722 includes various geometrical patterns, for example, an IC layout design for an IC device 760, for example, the floorplans 30 discussed above with respect to FIGS. 3A-3B. The geometrical patterns correspond to patterns of metal, oxide, or semiconductor layers that make up the various components of IC device 760 to be fabricated. The various layers combine to form various IC features. For example, a portion of IC design layout diagram 722 includes various IC features, such as an active region, gate electrode, source and drain, conductive segments or vias of an interlayer interconnection, to be formed in a semiconductor substrate (such as a silicon wafer) and various material layers disposed on the semiconductor substrate. Design house 720 implements a proper design procedure to form IC design layout diagram 722. The design procedure includes one or more of logic design, physical design or place and route. IC design layout diagram 722 is presented in one or more data files having information of the geometrical patterns. For example, IC design layout diagram 722 can be expressed in a GDSII file format or DFII file format.

Mask house 730 includes data preparation 732 and mask fabrication 744. Mask house 730 uses IC design layout diagram 722 to manufacture one or more masks 745 to be used for fabricating the various layers of IC device 760 according to IC design layout diagram 722. Mask house 730 performs mask data preparation 732, where IC design layout diagram 722 is translated into a representative data file ("RDF"). Mask data preparation 732 provides the RDF to mask fabrication 744. Mask fabrication 744 includes a mask writer. A mask writer converts the RDF to an image on a substrate, such as a mask (reticle) 745 or a semiconductor wafer 753. The IC design layout diagram 722 is manipulated by (mask) data preparation 732 to comply with particular characteristics of the mask writer and/or requirements of IC fab 750. In FIG. 7, data preparation 732 and mask fabrication 744 are illustrated as separate elements. In some embodiments, data preparation 732 and mask fabrication 744 can be collectively referred to as mask data preparation.

In some embodiments, data preparation 732 includes optical proximity correction (OPC) which uses lithography enhancement techniques to compensate for image errors, such as those that can arise from diffraction, interference, other process effects and the like. OPC adjusts IC design layout diagram 722. In some embodiments, data preparation 732 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, data preparation 732 includes a mask rule checker (MRC) that checks the IC design layout diagram 722 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 722 to compensate for limitations during mask fabrication 744, which may undo part of the modifications performed by OPC in order to meet mask creation rules.

In some embodiments, data preparation 732 includes lithography process checking (LPC) that simulates processing that will be implemented by IC fab 750 to fabricate IC device 760. LPC simulates this processing based on IC design layout diagram 722 to create a simulated manufactured device, such as IC device 760. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 722.

It should be understood that the above description of data preparation 732 has been simplified for the purposes of clarity. In some embodiments, data preparation 732 includes additional features such as a logic operation (LOP) to modify the IC design layout diagram 722 according to manufacturing rules. Additionally, the processes applied to IC design layout diagram 722 during data preparation 732 may be executed in a variety of different orders.

After data preparation 732 and during mask fabrication 744, a mask 745 or a group of masks 745 are fabricated based on the modified IC design layout diagram 722. In some embodiments, mask fabrication 744 includes performing one or more lithographic exposures based on IC design layout diagram 722. In some embodiments, an electron-beam (e-beam) or a mechanism of multiple e-beams is used to form a pattern on a mask (photomask or reticle) 745 based on the modified IC design layout diagram 722. Mask 745 can be formed in various technologies. In some embodiments, mask 745 is formed using binary technology. In some embodiments, a mask pattern includes opaque regions and transparent regions. A radiation beam, such as an ultraviolet (UV) beam, used to expose the image sensitive material layer (for example, photoresist) which has been coated on a wafer, is blocked by the opaque region and transmits through the transparent regions. In one example, a binary mask version of mask 745 includes a transparent substrate (for example, fused quartz) and an opaque material (for example, chromium) coated in the opaque regions of the binary mask. In another example, mask 745 is formed using a phase shift technology. In a phase shift mask (PSM) version of mask 745, various features in the pattern formed on the phase shift mask are configured to have proper phase difference to enhance the resolution and imaging quality. In various examples, the phase shift mask can be attenuated PSM or adjusting PSM. The mask(s) generated by mask fabrication 744 is used in a variety of processes. For example, such a mask(s) is used in an ion implantation process to form various doped regions in semiconductor wafer 753, in an etching process to form various etching regions in semiconductor wafer 753, and/or in other suitable processes.

IC fab 750 includes wafer fabrication 752. IC fab 750 is an IC fabrication business that includes one or more manufacturing facilities for the fabrication of a variety of different IC products. In some embodiments, IC fab 750 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 750 uses mask(s) 745 fabricated by mask house 730 to fabricate IC device 760. Thus, IC fab 750 at least indirectly uses IC design layout diagram 722 to fabricate IC device 760. In some embodiments, semiconductor wafer 753 is fabricated by IC fab 750 using mask(s) 745 to form IC device 760. In some embodiments, the IC fabrication includes performing one or more lithographic exposures based at least indirectly on IC design layout diagram 722. Semiconductor wafer 753 includes a silicon substrate or other proper substrate having material layers formed thereon. Semiconductor wafer 753 further includes one or more of various doped regions, dielectric features, multilevel interconnects, and the like (formed at subsequent manufacturing steps).

As described above, a method and a system are provided in the present disclosure for predicting SIR before placement stage which significantly shortens SIR querying time compared with it done at verification stage in APR system. With adoption of data-shift compensation, the SIR prediction results are more accurate on floorplan data which is for prediction. Automatic bump optimization for searching the optimal bump locations avoids more optimization iterations caused by traditional "trial and error" (manual trial runs) method. It highly accelerates runtime for SIR prediction by around 45%, providing accuracy of SIR results.

In some embodiments, a method is provided, including following operations: receiving, by a static voltage drop (SIR) prediction circuitry, floorplan data of a floorplan layout of a semiconductor device; generating a first SIR result by a machine learning model based on the floorplan data; generating a first similarity value based on a comparison of the floorplan data with a plurality of training data; generating a second SIR result based on the first SIR result and a first compensation value, corresponding to the first similarity value, in a mapping table; and generating a bump assignment data to update the floorplan data based on a comparison between the second SIR result with a plurality of predetermined SIR values.

In some embodiments, A system is provided, includes a static voltage drop (SIR) prediction circuitry comprising a machine learning circuitry trained based on a plurality of training data associated with a plurality of electronic device designs to predict a SIR result, and configured to: receive floorplan data of the floorplan layout; generate a SIR result and a first similarity result; adjust the SIR result based on the first similarity result; and predict an optimized SIR result based on the SIR result and a plurality of bump assignments before placing a plurality of cells in a floorplan layout.

In some embodiments, a method is provided, including following operations: training a machine learning model in a machine learning circuitry based on a plurality of training data associated with a plurality of electronic device designs and a plurality of test data; generating a mapping table including a plurality of compensation values and a plurality of similarity values based on the plurality of training data and a plurality of test data; and predicting a SIR result, by the machine learning model, based on a floorplan data and the mapping table.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:

receiving, by a static voltage drop (SIR) prediction circuitry, floorplan data of a floorplan layout of a semiconductor device;

generating a first SIR result by a machine learning model based on the floorplan data;

generating a first similarity value based on a comparison of the floorplan data with a plurality of training data;

generating a second SIR result based on the first SIR result and a first compensation value, corresponding to the first similarity value, in a mapping table; and generating a bump assignment data to update the floorplan data based on a comparison between the second SIR result with a plurality of predetermined SIR values.

2. The method of claim 1, wherein the second SIR result equals to a sum of the first SIR result and the first compensation value.

3. The method of claim 1, further comprising:

when the first similarity value is less than a threshold value, re-training the machine learning model with the floorplan data and a corresponding SIR result.

4. The method of claim 1, further comprising:

generating a bump assignment;

generating a bump SIR result corresponding to the bump assignment and the floorplan data by the machine learning model;

comparing the bump SIR result with a previous bump SIR result to obtain an updated bump assignment;

iterating from step of the generating the bump assignment to step of comparing the bump SIR result until a maximum iteration of optimization reaches a pre-determined number; and output the updated bump assignment for the bump assignment data.

5. The method of claim 4, further comprising:

setting a SIR optimization threshold; and comparing an updated bump SIR result with the SIR optimization threshold to output the updated bump assignment for the bump assignment data.

6. The method of claim 4, further comprising:

when the bump SIR result is smaller than the previous bump SIR result, replacing the updated bump assignment with the bump assignment; and when the bump SIR result is greater than the previous bump SIR result and a difference between the bump SIR result and the previous bump SIR result is within a range, replacing the updated bump assignment with the bump assignment.

7. The method of claim 1, further comprising:

generating a third SIR result being a sum of a fourth SIR result, provided by the machine learning model based on the updated floorplan data, and a second compensation value corresponding to a second similarity value associated with a comparison of the updated floorplan data with the plurality of training data.

8. The method of claim 1, further comprising:

manufacturing the semiconductor device based on the updated floorplan data.

9. A system, comprising:

a static voltage drop (SIR) prediction circuitry comprising a machine learning circuitry trained based on a plurality of training data associated with a plurality of electronic device designs to predict a SIR result, and configured to:

receive floorplan data of a floorplan layout;

generate a SIR result and a first similarity result;

adjust the SIR result based on the first similarity result; and predict an optimized SIR result based on the SIR result and a plurality of bump assignments before placing a plurality of cells in a floorplan layout.

10. The system of claim 9, wherein the SIR prediction circuitry is further configured to generate a SIR violation map indicating locations of predicted SIR violation in the floorplan layout based on the SIR result.

11. The system of claim 9, wherein the SIR prediction circuitry is further configured to:

sorting the plurality of training data for an adversarial detection model to generate a plurality of similarity values based on the plurality of training data that are sorted and a plurality of test data; and generate a plurality of compensation values based on a comparison between a plurality of predicted SIR values generated by the machine learning circuitry and a plurality of test SIR values corresponding to the plurality of test data, wherein the system further comprises:

a mapping files database configured to store the plurality of compensation values and the plurality of similarity values in a mapping table.

12. The system of claim 11, wherein the SIR prediction circuitry is further configured to lookup the mapping table for a first compensation value corresponding to the first similarity result for adjusting the SIR result by adding the first compensation value with the SIR result.

13. The system of claim 11, wherein the similarity values are inversely proportional to the compensation values.

14. The system of claim 9, further comprising:

a SIR results database configured to store the SIR result; and a bump assignment database configured to store the plurality of bump assignments, wherein the SIR prediction circuitry is communicatively coupled to the SIR results database and the bump assignment database, and configured to:

compare the SIR result with a SIR threshold value;

generate a plurality of bump SIR results based on the plurality of bump assignments and the floorplan data; and determine a lowest value, of the plurality of bump SIR results, as the optimized SIR result and update the floorplan data.

15. The system of claim 9, further comprising:

a bump assignment adjustment circuitry configured to decrease a bump pitch between a plurality of bumps in the plurality of bump assignments in response to the SIR prediction circuitry predicting the optimized SIR result.

16. A method, comprising:

training a machine learning model in a machine learning circuitry based on a plurality of training data associated with a plurality of electronic device designs and a plurality of test data;

generating a mapping table including a plurality of compensation values and a plurality of similarity values based on the plurality of training data and the plurality of test data; and predicting a static voltage drop (SIR) result, by the machine learning model, based on a floorplan data and the mapping table.

17. The method of claim 16, further comprising:

extracting the plurality of training data from a plurality of training floorplan layouts before a placement stage; and extracting the plurality of test data from a plurality of test floorplan layouts before a placement stage.

18. The method of claim 16, wherein generating the mapping table comprises:

sorting the plurality of training data to obtain a plurality of sorted training data;

training an adversarial detection model based on the plurality of sorted training data and the plurality of test data to generate the plurality of similarity values; and generating the plurality of compensation values based on difference between a plurality of predicted SIR values generated by the machine learning model and a plurality of test SIR values corresponding to the plurality of test data.

19. The method of claim 16, further comprising:

generating a predicted SIR result, by the machine learning model based on the floorplan data;

generating a similarity value corresponding to the floorplan data;

looking up a corresponding compensation value in the mapping table according to the similarity value; and compensating the predicted SIR result with the corresponding compensation value for predicting the SIR result.

20. The method of claim 19, further comprising:

when the similarity value is excluded from the mapping table, re-training the machine learning model with the floorplan data and a corresponding SIR result.

* * * * *